United States Patent [19]
Matsuoka

[11] Patent Number: 5,338,703
[45] Date of Patent: Aug. 16, 1994

[54] METHOD FOR PRODUCING A RECESSED GATE FIELD EFFECT TRANSISTOR

[75] Inventor: Hiroshi Matsuoka, Itami, Japan

[73] Assignee: Mitsubishi Denki Kabushiki Kaisha, Tokyo, Japan

[21] Appl. No.: 86,895

[22] Filed: Jul. 7, 1993

[30] Foreign Application Priority Data

Oct. 26, 1992 [JP] Japan .................. 4-311426

[51] Int. Cl.⁵ .................................. H01L 21/44
[52] U.S. Cl. .............................. 437/203; 437/187; 437/912; 437/947; 437/229; 156/644; 148/DIG. 161
[58] Field of Search ............... 437/187, 203, 912, 947, 437/229; 156/644; 148/161

[56] References Cited

U.S. PATENT DOCUMENTS

| | | | |
|---|---|---|---|
| 4,700,462 | 10/1987 | Beaubien et al. | 437/187 |
| 5,122,387 | 6/1992 | Takenaka et al. | 427/35 |
| 5,190,892 | 3/1993 | Sano | 437/180 |

FOREIGN PATENT DOCUMENTS

| | | |
|---|---|---|
| 60-100432 | 6/1985 | Japan . |
| 63-21877 | 1/1988 | Japan . |
| 63-90171 | 4/1988 | Japan . |
| 64-2372 | 1/1989 | Japan . |
| 1-024465 | 1/1989 | Japan . |
| 1-175772 | 7/1989 | Japan . |
| 3-239337 | 10/1991 | Japan . |

Primary Examiner—George Fourson
Assistant Examiner—David M. Mason
Attorney, Agent, or Firm—Leydig Voit & Mayer

[57] ABSTRACT

In a method for producing a recessed gate field effect transistor including a recess in a semiconductor substrate and a gate electrode disposed in the recess, a photoresist film is applied to the semiconductor substrate and source and drain electrodes on the substrate, a first insulating film is formed on the photoresist film, a resist pattern, which has an opening for processing the first insulating film and the photoresist film are etched using the resist pattern as a mask to form an opening having a width increasing in the direction of the substrate, a second insulating film is formed on opposite side walls of the opening, the semiconductor substrate is etched using the opening narrowed by the second insulating film in the substrate to form a recess, the second insulating film is selectively removed by etching, gate metal is deposited on the photoresist and on the substrate in the recess, and unnecessary gate metal is removed by lifting-off the resist film.

13 Claims, 7 Drawing Sheets

METHOD FOR PRODUCING A RECESSED GATE FIELD EFFECT TRANSISTOR

FIELD OF THE INVENTION

The present invention relates to a method for producing a field effect transistor (hereinafter referred to an FET) and, more particularly, to a method for producing an FET including a recessed gate.

BACKGROUND OF THE INVENTION

Figure 7A:
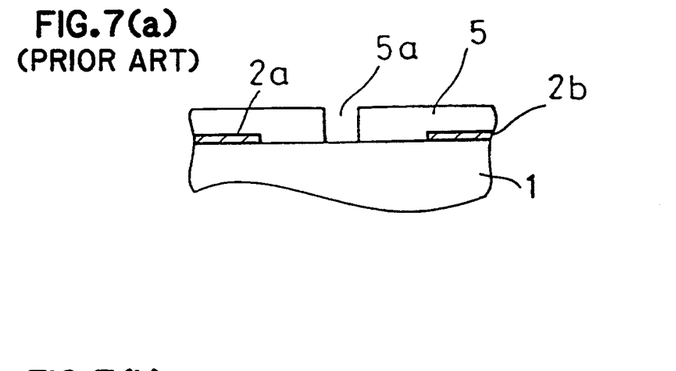
FIGS. 7(a)–7(d) are cross-sectional views illustrating a production flow of an FET in accordance with a prior art.
Figure 7B:
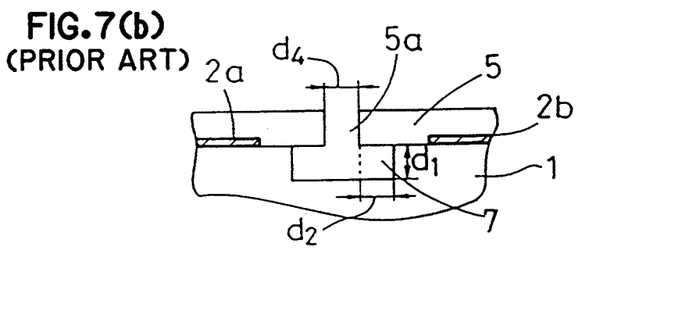
Figure 7C:
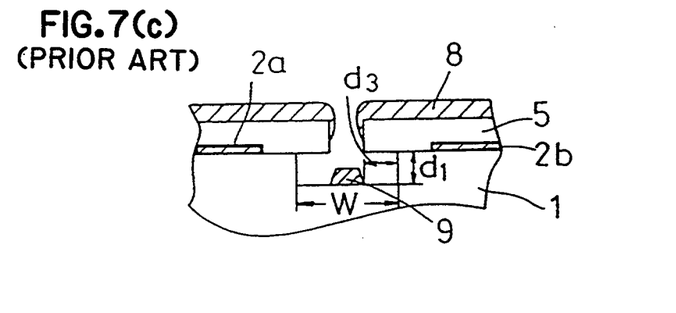
Figure 7D:
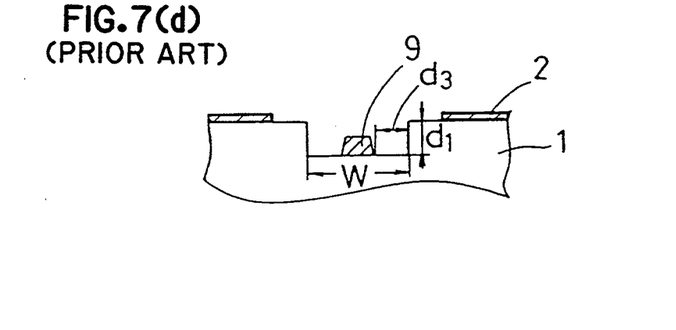

FIGS. 7(a) to 7(d) are cross-sectional views illustrating a production flow in a method for producing a prior art FET including a recess gate and a structure thereof. In these figures, reference numeral 1 designates a GaAs semiconductor substrate on which source and drain electrodes 2a and 2b are disposed. A photoresist 5 for forming a gate recess is formed on the substrate 1, covering the source and drain electrodes 2a and 2b and including an opening 5a for forming a gate recess. A recess 7 is formed by etching the substrate 1 through the opening 5a in the resist 5. Gate metal 8 is formed on the resist 5 by deposition. Gate metal 9 deposited in the recess 7 becomes a gate electrode. FIG. 7(d) is a cross-sectional view of the completed FET having a recess gate.

The recess type FET shown in FIG. 7(d) is conventionally produced in accordance with the following production flow. As shown in FIG. 7(a), the resist pattern 5 having an opening 5a of dimension d4 corresponding to the gate pattern is formed on the substrate 1. Then, as shown in FIG. 7(b), employing the resist 5 as a mask, a portion of the substrate 1 is removed by wet etching employing a tartaric acid series etchant or a phosphoric acid series etchant, thereby forming a recess 7. Then, as shown in FIG. 7(c), gate metal 8 is deposited in the state where the resist pattern 5 is disposed. Here, a metal pattern 9 directly formed on the substrate 1 becomes the gate electrode. Finally, the gate metal 8 and the resist films 5 are removed as shown in FIG. 7(d), thereby completing the FET.

Since the method for producing the prior art recess type FET is constituted as described above and the recess is formed by wet etching, a side portion of the recess of dimension d2 approximately equal to the depth d1 of the recess (d2=d1) is etched. Accordingly, there is a problem that the width w of the recess 7, more specifically, a distance d3 between an end part of the recess 7 and an end part of the gate electrode 9, depends on the depth d1 of the recess (d3=d2=d1, w=d4+2d3).

Therefore, in such a GaAs FET utilized in a high frequency band of several tens of GHz, when the above-described d3 is increased, the rise of the output signal against the input signal is flat, resulting in an unfavorable a transistor characteristic.

SUMMARY OF THE INVENTION

It is an object of the present invention to provide a method for producing a semiconductor device that provides a further high-performance recess type FET including a recess of a desired width without depending on the depth of the recess.

Other objects and advantages of the preset invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In a method for producing an FET having a recess in accordance with a first aspect of the present invention, a recess is formed employing a resist opening width at the start of the recess etching, which width is smaller than the opening width of the original resist pattern for forming a gate electrode.

More specifically, the production method of the present invention includes a step of applying a photoresist spacer film for lifting-off on a semiconductor substrate on which source and drain electrodes are formed, a step of forming a first insulating film thereon, a step of forming a resist pattern having an opening for processing the first insulating film thereon, a step of forming an opening whose dimension increases downwards by etching the first insulating film and the photoresist spacer film using the resist as a mask, a step of forming a pair of side walls comprising second insulating films on both sides of the opening, which side walls have thicknesses in a transverse direction at the lower end part thereof that are larger than the side etching amount of the recess in a subsequent process, a step of forming a recess by etching the semiconductor substrate through the opening narrowed by the pair of side walls, a step of selectively removing the side walls by etching, a step of depositing gate metal thereon, and a step of removing unnecessary gate metal by lifting-off.

In a production method according to a second aspect of the present invention, as the photoresist spacer film in the first aspect of the present invention, PMGI (poly dimethyl glutarimide) or PMMA (poly methylmethacrylate) is employed, and the method includes a step of directly forming a photoresist on the photoresist of PMGI or PMMA, a step of etching the PMGI or PMMA resist using the photoresist as a mask, a step of forming side walls comprising insulating films on the side walls of the photoresist of PMGI or PMMA, a step of forming a recess by etching the semiconductor substrate through an opening produced by the photoresist of PMGI or PMMA and the side walls as a mask, a step of selectively removing the side walls by etching, a step of depositing gate metal thereon, and a step of removing unnecessary gate metal by lifting-off.

A production method according to a third aspect of the present invention includes a step of directly forming a photoresist having an opening on a substrate without applying the PMGI or PMMA photoresist spacer that is applied in the second aspect of the present invention, a step of forming side walls comprising insulating films aside the photoresist by photo-assisted CVD, a step of forming a recess by etching the semiconductor substrate through an opening produced by the photoresist and the side walls as a mask, a step of selectively removing the side walls by etching, a step of depositing gate metal thereon, and a step of removing unnecessary gate metal by lifting-off.

A production method according to a fourth aspect of the present invention includes a step of forming a dummy gate comprising a first insulating film on the semiconductor substrate on which source and drain electrodes are formed, a step of forming side walls comprising second insulating films on both sides of the dummy gate, a step of applying photoresist on the entire surface and etching-back the same to expose the head, a step of selectively removing the dummy gate by etching, a step of forming a recess by etching the semiconductor substrate through an opening of the removed dummy gate, a step of selectively removing the side walls by etching, a step of depositing gate metal using the resist pattern formed by the etching-back as a mask, and a step of removing unnecessary gate metal by lifting-off.

In a production method according to a fifth aspect of the present invention, the step of producing a dummy gate in the fourth aspect comprises a step of producing an aluminum film on a first insulating film a part of which is to be a dummy gate, a step of producing a super-fine resist thereon, a step of etching the aluminum film using the resist as a mask, and a step of producing a dummy gate by etching the first insulating film using the aluminum film as a mask.

BRIEF DESCRIPTION OF THE DRAWINGS

FIGS. 2(a)–2(h) are cross-sectional views illustrating a production flow of an FET in accordance with a second embodiment of the present invention;

DETAILED DESCRIPTION OF THE PREFERRED EMBODIMENTS

Embodiment 1

A description is given of a first embodiment of the present invention with reference to FIGS. 1(a) to 1(i). In these figures, reference numeral 1 designates a GaAs semiconductor substrate. Reference numeral 2 designates source and drain electrodes comprising AuGe series ohmic electrodes, disposed on the substrate 1. Reference numeral 3 designates a spacer film comprising PMGI (poly dimethyl glurtarimide), PMMA (poly methlmethacrylate), or the like, for use during lifting-off of gate metal. A first insulating film 4 comprising SiO is disposed to form a dummy pattern corresponding to a resist pattern used for forming a gate electrode. Reference numeral 5 designates a resist pattern used for forming a gate electrode, having an opening 5a. Reference numeral 4a designates an opening formed in the insulating film 4 and the photoresist film 3 by dry etching, such as plasma etching through the opening 5a. Here, isotropic etching is performed by controlling pressure in a vacuum, gas flow rate, plasma density, and a like, whereby the recess-shaped opening having a width increasing toward the substrate with a desired angle is formed. Reference numeral 6 designates side walls formed in the recess-shaped opening 4a. The insulating film comprising SiN is deposited by CVD and then removed by RIE, whereby these side walls are formed. An interval between the side walls is a pattern size which is required during recess etching at a subsequent process. This size can be obtained with improved controllability and productivity if the conditions of RIE are established properly in advance. Reference numeral 7 designates a recess in the substrate 1 and it is formed using the opening between the side walls as a mask. Reference numeral 8 designates gate metal. Reference numeral 9 designates a gate electrode.

Next, A description is given of the method for producing an FET in accordance with the present invention.

Figure 1A:
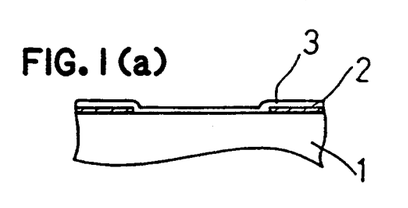
FIGS. 1(a)–1(i) are cross-sectional views illustrating a production flow of an FET in accordance with a first embodiment of the present invention.

In FIG. 1(a), the resist film 3 approximately 3000 Å thick is applied on the entire surface of the semiconductor wafer 1 on which the source and drain electrodes 2 approximately 3000 Å thick are formed. This resist film 3 is the spacer layer during the later process of lifting-off of gate metal.

Figure 1B:
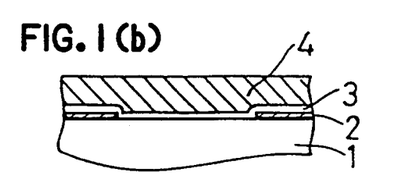

In FIG. 1(b), an SiO insulating film 4 approximately 1.2 $\mu$m thick is formed on the resist film 3, to form a dummy pattern corresponding to the resist pattern for forming a gate electrode.

Figure 1C:
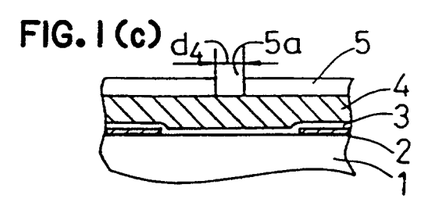
Figure 1D:
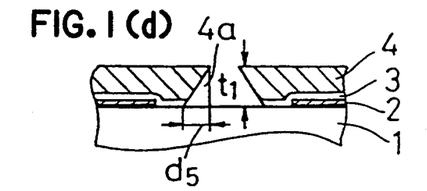

In FIG. 1(c), the resist pattern 5 comprising a conventional photoresist for forming a gate electrode is formed on the insulating film 4. It is required that this resist pattern includes the opening 5a of dimension d4 (=0.5 $\mu$m) corresponding to the pattern for forming a gate electrode.

In FIG. 1 (d), using the resist pattern 5 as a mask, the insulating film 4 and the photoresist film 3 are etched by plasma dry etching. Here, when the dry etching is carried out in a high vacuum ambient, the opening 4a has a width that increases in the direction of the semiconductor wafer 1 as shown in the figure. For example, when t1=1.2 $\mu$m, the width increases by d5=0.3~0.4 $\mu$m in both left and right directions at the deepest part.

Figure 1E:
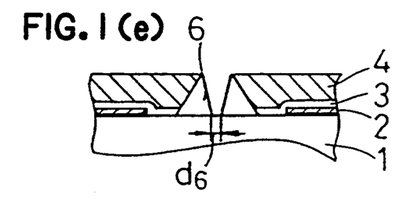

In FIG. 1(e), the SiN insulating film 6 is deposited in the recessed portion 4a in the photoresist 3 and the insulating film pattern 4 by CVD and a portion thereof is removed by RIE, whereby the side walls 6 comprising SiN are formed. Then, the interval d6 between both side walls is about 0.2 $\mu$m which is approximately equal to a pattern size required during recess etching for forming a gate recess at a subsequent process. This dimension can be produced with improved controllability and reproducibility if the etching conditions of RIE are established properly. In addition, the thickness d7 (=0.45~0.55 $\mu$m) in a transverse direction of the side wall 6 is required to be controlled in accordance with the depth d1 (=5000 Å) and the width w (=1.0~1.2 $\mu$m) which are obtained by the recess etching conducted in a subsequent process, whereby this thickness can also be produced with improved controllability by establishing the etching conditions.

Figure 1F:
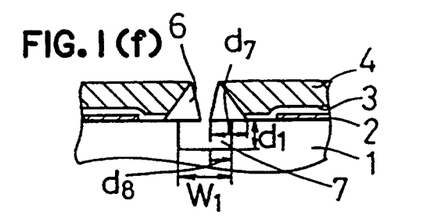

In FIG. 1(f), the recess 7 is formed by wet etching with a tartaric acid series etchant or a phosphoric acid series etchant, using the side walls 6 as a mask. As is evident from the figure, the side etched width d8 of the recess is approximately equal to the etched depth d1 in this case (d8=d1=0.40~0.50 $\mu$m) and it does not exceed the thickness d7 (=0.45~0.55 $\mu$m) of the side wall 6. This etching depth (width) is controlled by carrying out the etching with a current flowing between the source and drain electrodes. At this time, the current is adjusted while observing the current to obtain a desired current value.

Figure 1G:
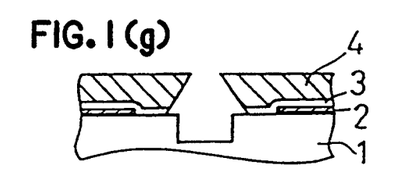

In FIG. 1(g), the SiN side walls 6 are selectively removed by a phosphoric acid series etchant.

Figure 1H:
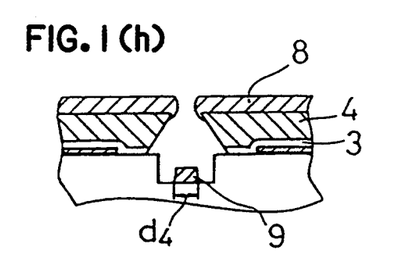

In FIG. 1(h), the gate metal 8 comprising AuGe is deposited on the sample in the state of FIG. 1(g). At this time, it is found that the width of the gate electrode 9 formed in the recess 7 is determined in accordance with the dimension d4 (=0.5 µm) of the opening 5a in the resist pattern 5 formed in FIG. 1(c).

Figure 1I:
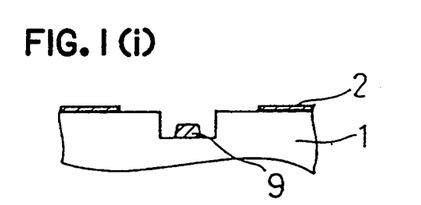
Figure 2A:
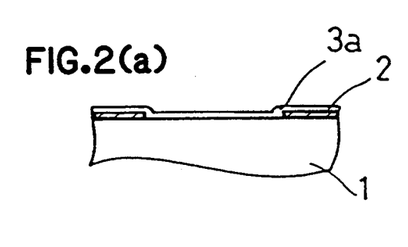
Figure 2B:
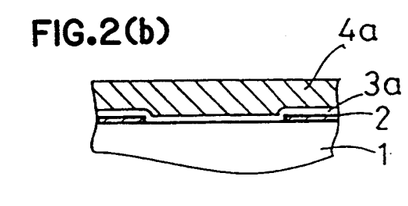
Figure 2C:
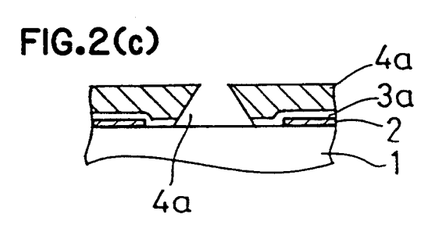
Figure 2D:
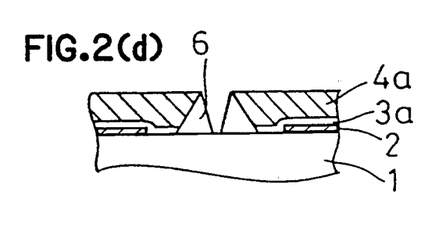
Figure 2E:
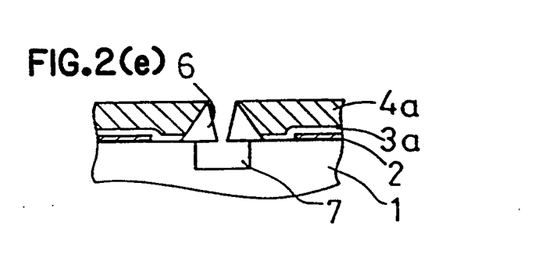
Figure 2G:
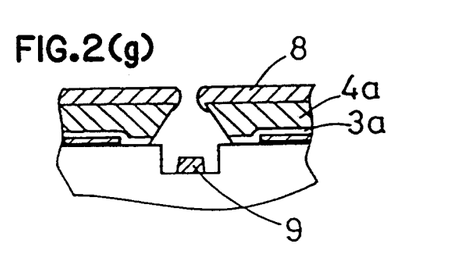
Figure 2H:
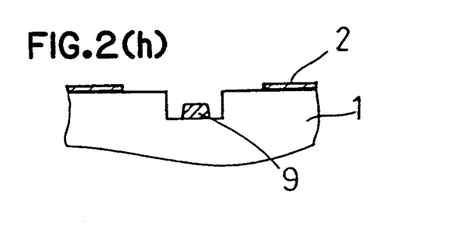
Figure 3A:
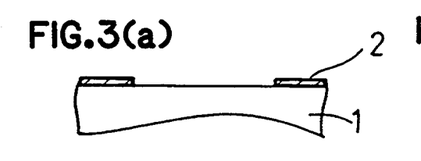
FIGS. 3(a)–3(h) are cross-sectional views illustrating a production flow of an FET in accordance with a third embodiment of the present invention.
Figure 3B:
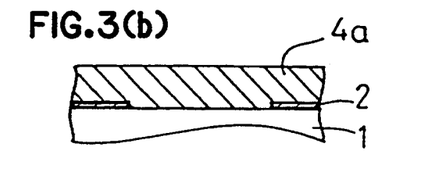
Figure 3C:
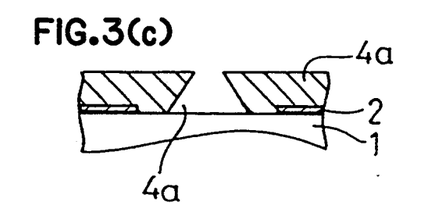
Figure 3D:
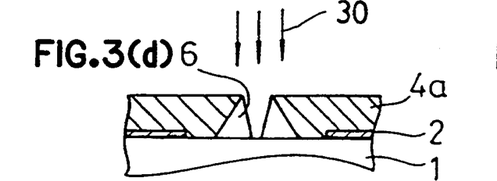
Figure 3E:
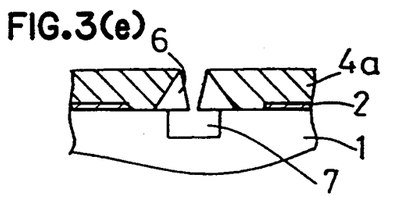
Figure 3F:
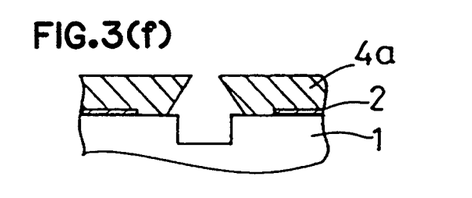
Figure 3G:
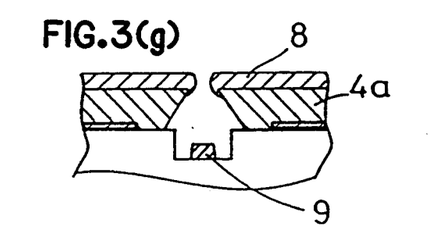
Figure 3H:
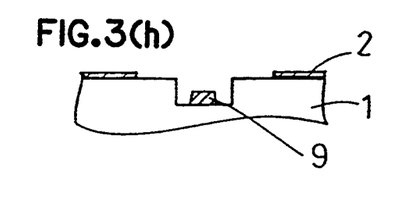

In FIG. 1(i), using the photoresist films 3 of the lowermost layer as a mask, unnecessary insulating films 4 and gate metal 8 are removed by lift off using acetone.

The following is found as a characteristic of the present invention. The dimension d4 (=0.5 µm) of the opening 5a in the resist pattern 5 determines the width of the gate electrode 9, and the recess 7 formed by etching the substrate with the dimension d6 (=0.2 µm) of the opening between side walls is formed in the opening 4a in the insulating film pattern 4. In this way, the gate electrode 9 and the recess 7 are formed with the dimensions d4 and d6 which are different from each other.

In the first embodiment, if the thickness d7 in a transverse direction of the side wall is controlled at, for example, 0.45 to 0.55 µm, the distance between the end part of the gate electrode 9 and the end part of the recess 7 can be controlled to a desired dimension of approximately 0.3 to 0.35 µm.

Embodiment 2

In the above-described embodiment, the photoresist used as the spacer film for is formed on the substrate and the SiO insulating film 4 is employed as the dummy pattern on this photoresist. In a second embodiment illustrated in FIGS. 2(a) to 2(h), when a material which does not mix with the photoresist, i.e., for example, PMGI, PMMA, or the like, is employed as the spacer film, the pattern is formed by directly using the photoresist in place of the SiO insulating films 4 employed as the dummy pattern. In this case, the processes are simplified with the same effects as described above.

FIGS. 2(a) to 2(h) illustrate a method for producing an FET in accordance with this second embodiment. In these figures, reference numeral 3a designates a resist material, such as PMGI, PMMA, or the like, employed in place of the photoresist 3 serving as the spacer film in the above-described first embodiment. Reference numeral 4a designates a photoresist, employed in place of the insulating film 4 in the first embodiment. The processes of this second embodiment are simplified because the process of FIG. 1(c) in the first embodiment is omitted.

Embodiment 3

In the above-described first and second embodiments, when the side walls 6 are formed, the spacer films 3 and 3a for lifting-off, such as PMGI or the like, are required, because of damage to the dummy patterns 4 and 4a. However, when photo-assisted CVD is utilized during forming the side walls 6, the side walls can be formed without damaging the resist. Accordingly, the spacer films 3 and 3a for lifting-off, such as PMGI or the like, can be omitted, and further, the processes can be simplified with the same effects as described above.

FIGS. 3(a) to 3(d) illustrate a method for producing an FET in accordance with a third embodiment as described above. In these FIGS., the same reference numerals as in FIG. 2 designate the same parts. Reference numeral 30 indicates a photo-assisted CVD. Further, in the process of FIG. 3(d), the insulating film is formed by the photo-assisted CVD process, and thereafter, only the opening of the width d6 is removed by RIE to form the side walls 6 of the insulating film shown in the figure.

Embodiment 4

FIGS. 4(a) to 4(h) illustrate a method for producing an FET in accordance with a fourth embodiment of the present invention. Reference numeral 1 designates a GaAs substrate, reference numeral 2 designates source and drain electrodes, reference numeral 10 designates a dummy gate comprising an SiN film, reference numeral 11 designates side walls comprising SiO, reference numeral 12 designates a flattened resist, reference numeral 13 designates an opening produced after removing the dummy gate, reference numeral 7 designates a recess, reference numeral 8 designates gate metal, and reference numeral 9 designates a gate electrode.

Next, a description is given of the production method.

Figure 4A:
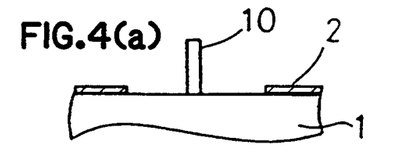
FIGS. 4(a)–4(h) are cross-sectional views illustrating a production flow of an FET in accordance with a fourth embodiment of the present invention.

In FIG. 4(a), the dummy gate 10 comprising SiN is formed on the wafer 1 on which the source and drain electrodes 2 are formed. An SiN film is deposited on the entire surface of the wafer and thereafter it is processed using the resist as a mask (not shown), whereby the dummy gate is formed. This dummy gate 10 serves as an opening at the start of the formation of the recess in a subsequent process.

Figure 4B:
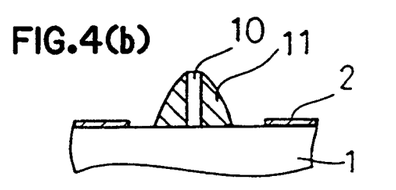

In FIG. 4(b), the side walls 11 comprising SiO are formed on both sides of the dummy gate 10 formed in FIG. 4(a). SiO is deposited on the entire surface of the wafer by CVD, and then, it is removed by RIE so as to form the side walls 11 of the shape as shown in the figure.

Figure 4C:
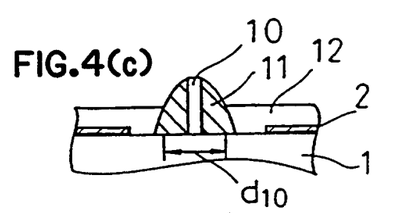

In FIG. 4(c), the resist 12 is deposited on the wafer on which the side walls 11 are formed, and thereafter, etching-back is first conducted to flatten the photoresist 12 and second to expose the photoresist 12, thereby exposing the head of the dummy gate 10.

Figure 4D:
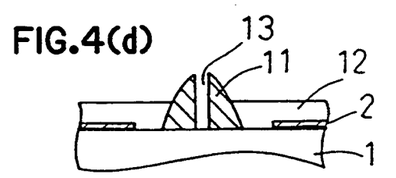

In FIG. 4(d), the dummy gate 10 comprising SiN and disposed on the wafer, on which the heads of the dummy gate 10 and the side walls 11 are exposed, is removed using a hydrofluoric acid series etchant, resulting in the opening 13 for starting the formation of the recess. At this time, the relative etching rates of SiO and SiN can be changed by changing concentration of the hydrofluoric acid, whereby the SiN 10 can be selectively etched leaving the SiO 11.

Figure 4E:
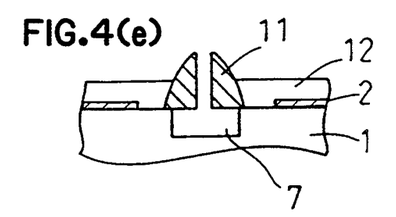

In FIG. 4(e), the wafer 1 is etched with a tartaric acid series or a phosphoric acid series etchant on the basis of the dimension of the dummy gate 10, resulting in the recess 7.

Figure 4F:
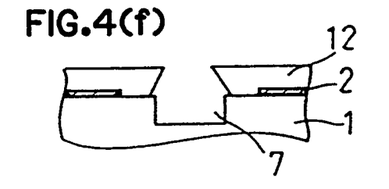

In FIG. 4(f), after the recess 7 is formed, the side walls 11 are selectively removed with a hydrofluoric acid series etchant.

Figure 4G:
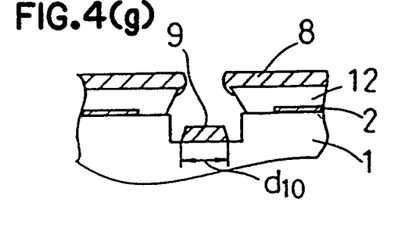

In FIG. 4(g), the gate metals 8 and 9 are deposited.

Figure 4H:
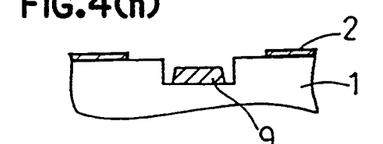

In FIG. 4(h), the gate metal 8 is removed by lifting-off.

In the fourth embodiment, after forming the dummy gate 10 corresponding to the dimension at the start of the recess etching of the gate, the side walls 11 are formed at the sides of this dummy gate and the thick photoresist 12 is deposited and then the heads of the side walls 11 are exposed by the etching-back process. Therefore, the dimension of the gate electrode 9 is determined by the etching-back process of the photoresist 12, i.e, the opening dimension in the photoresist 12 at that time. Consequently, the distance between the end part of the gate electrode 9 and the end part of the recess 7 can be precisely determined to be a desired dimension because the opening dimension of the photoresist 12 formed by the etching-back process is precisely determined.

Embodiment 5

While in the fourth embodiment the dummy gate is made of an insulating film comprising SiN, it may be made of a refractory metal such as WSi or the like. In this fifth embodiment, a process for removing the WSi may be carried out by a mixture of $SF_6$ and $CHF_3$, with the same effects as in the fourth embodiment.

Embodiment 6

While in the fourth embodiment the dummy gate is made of SiN, it may be made of Al. In this sixth embodiment, hydrochloric acid is used for removing the Al dummy gate, with the same effects as in the fourth embodiment.

Embodiment 7

Figure 5A:
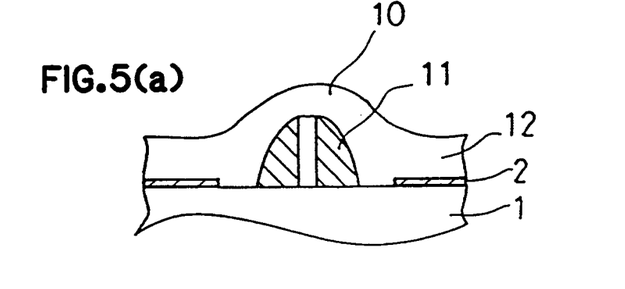
FIGS. 5(a)–5(d) are cross-sectional views illustrating a production flow of an FET in accordance with a seventh embodiment of the present invention.
Figure 5B:
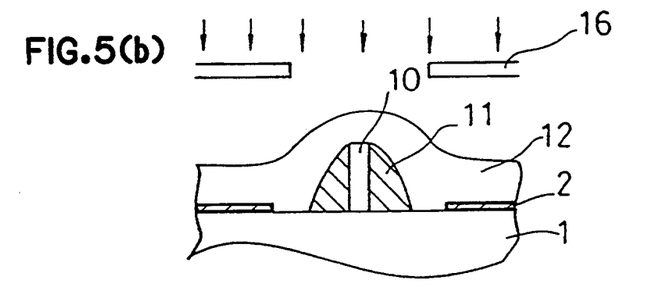
Figure 5C:
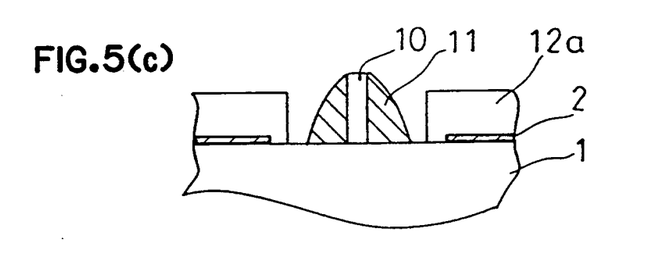
Figure 5D:
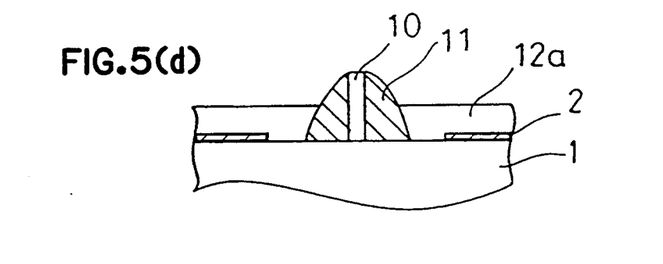

In addition, in the fourth embodiment the head of the dummy gate is exposed by etching-back after the resist 12 is applied. However, the following method may be used instead. In this seventh embodiment, the resist 12 is formed on the entire surface of the wafer, coating entirely the dummy gate 10 as illustrated in FIG. 5(a). A mask 16 is used, and exposure and development are conducted only to a main portion as illustrated in FIG. 5(b) to form the resist pattern 12a. Thereafter, the resist pattern 12a is thermally reflowed whereby the heads of the dummy gate and the side walls are exposed, with the same effects as in the fourth embodiment.

Embodiment 8

In the above-described fourth embodiment the dummy gate is produced because the resist pattern is formed on the insulating film and then the insulating film is processed using this pattern as a mask. In this eighth embodiment, the fine dummy gate pattern is produced by forming an Al film on the insulating film.

Figure 6A:
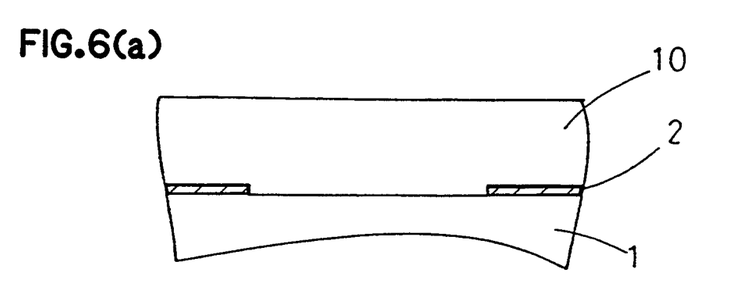
FIGS. 6(a)–6(c) are cross-sectional views illustrating a production flow of an FET in accordance with an eighth embodiment of the present invention.
Figure 6B:
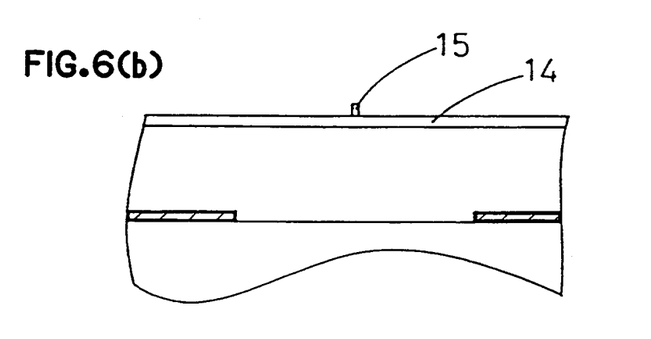
Figure 6C:
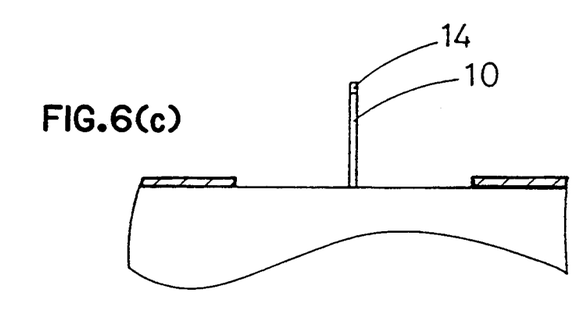

More specifically, initially, a planar SiN insulating film 10 is formed on the wafer 1 on which the source and drain electrodes 2 are formed as illustrated in FIG. 6(a). The Al film 14 is thin on the SiN insulating film as illustrated in FIG. 6(b), a super-fine resist 15 having width of about 0.1 μm is formed on the Al film, the Al film 14 is etched using the resist as a mask as illustrated in FIG. 6(c), and further, the SiN insulating film 10 is etched using a remaining portion of the Al film 14 as a mask, resulting in the super-fine dummy gate 10.

As described above, according to the method for producing an FET in accordance with the present invention, the recess is formed with the opening width at the start of the recess etching smaller than that of the opening in the original resist pattern, without using the resist pattern for forming a gate electrode. Therefore, a structure in which the distance between the sides of the recess and the sides of the gate electrode can be set to a desired value without depending on the recess depth and without, especially, requiring an advanced technique and highly-developed apparatus. As a result, an FET that has an improved device performance can be produced at low cost with at high productivity and precision.

What is claimed is:

1. A method for producing a recessed gate field effect transistor including a recess in a semiconductor substrate and a gate electrode disposed in the recess comprising:
    applying a photoresist film to a surface of a semiconductor substrate and to source and drain electrodes on the semiconductor substrate;
    forming a first insulating film on said photoresist film;
    forming a resist pattern having an opening on said first insulating film;
    etching said first insulating film and said photoresist film to form an opening having a width increasing in the direction of said semiconductor substrate using said resist pattern as a mask;
    forming a pair of side walls comprising a second insulating film in and at opposite sides of the opening in said first insulating film and said photoresist film;
    forming a recess by etching said semiconductor substrate using the opening narrowed by said side walls as a mask;
    selectively removing said side walls by etching;
    depositing gate metal on said first insulating film and on said semiconductor substrate in the recess to form a gate electrode; and
    removing unnecessary gate metal by dissolving said photoresist film.

2. The method for producing an FET of claim 1, wherein said first insulating film comprises silicon oxide and said second insulating film comprises silicon nitride.

3. The method for producing an FET of claim 1, wherein said photoresist film is one of PMGI (poly dimethyl glutarimide) and PMMA (poly methylmethacrylate).

4. The method for producing an FET of claim 3, wherein said second insulating film comprises silicon nitride.

5. The method for producing an FET of claim 1, wherein photo-assisted CVD is employed to form said second insulating film as a pair of side walls.

6. The method for producing an FET of claim 5, wherein said second insulating film comprises silicon nitride.

7. A method for producing an FET comprising:
    forming a dummy gate on a semiconductor substrate on which source and drain electrodes are present;
    forming side walls comprising first insulating film on both sides of and contacting said dummy gate;
    applying a photoresist film to said substrate covering said source and drain electrodes and said dummy gate;
    treating said photoresist film to expose part of said side walls;
    selectively removing said dummy gate by etching, leaving an opening between said side walls;
    forming a recess by etching said semiconductor substrate through the opening;
    selectively removing said side walls by etching;
    depositing gate metal on said resist film and in the recess to form a gate electrode; and
    removing unnecessary gate metal by dissolving said resist film.

8. The method for producing an FET of claim 7, wherein said dummy gate comprises silicon nitride and said first insulating film comprises silicon oxide.

9. The method for producing an FET of claim 7, wherein said dummy gate comprises a refractory metal including removing said dummy gate by etching with a mixture of $SF_6$ and $CHF_3$.

10. The method for producing an FET of claim 7, wherein said dummy gate comprises Al including removing said dummy gate by etching with hydrochloric acid.

11. The method for producing an FET of claim 7, including applying said photoresist film with an opening wider than said dummy gate and treating said photoresist film by thermally reflowing said photoresist film to cover part of said walls.

12. The method for producing an FET of claim 7, wherein said step of forming the dummy gate includes:

forming an Al film on a second insulating film;
forming a super-fine photoresist mask on said Al film;
etching said Al film using said super-fine photoresist mask to form a portion of said dummy gate; and
completing said dummy gate formation by etching said second insulating film using said dummy gate as a mask.

13. The method for producing an FET of claim 7, including applying said photoresist film to cover said dummy gate and side walls and etching-back said photoresist film to expose part of said side walls and said dummy gate.

* * * * *